(12) United States Patent
Whitten et al.

(10) Patent No.: US 7,039,842 B1
(45) Date of Patent: May 2, 2006

(54) MEASURING PROPAGATION DELAYS OF PROGRAMMABLE LOGIC DEVICES

(75) Inventors: Trent Dean Whitten, Beaverton, OR (US); Glenn Thomas O'Rourke, Portland, OR (US); Mose Sphere Wahlstrom, Aloha, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 442 days.

(21) Appl. No.: 10/441,814

(22) Filed: May 19, 2003

(51) Int. Cl.
*G01R 31/28* (2006.01)

(52) U.S. Cl. .................................... 714/725; 714/745

(58) Field of Classification Search ................ 375/354, 375/376; 368/113; 714/726, 725, 745; 716/4
See application file for complete search history.

(56) References Cited

U.S. PATENT DOCUMENTS

| | | | | |
|---|---|---|---|---|
| 5,745,533 A | * | 4/1998 | Asada et al. ................. | 375/354 |
| 6,069,849 A | * | 5/2000 | Kingsley et al. ............ | 368/113 |
| 6,219,305 B1 | * | 4/2001 | Patrie et al. ................. | 368/113 |
| 6,223,314 B1 | * | 4/2001 | Arabi et al. ................. | 714/726 |
| 6,483,886 B1 | * | 11/2002 | Sung et al. .................. | 375/376 |
| 6,493,851 B1 | * | 12/2002 | Bach et al. ..................... | 716/4 |

OTHER PUBLICATIONS

"AC Test Measurement Utilizing Built In Self Test", Lattice Semiconductor Corporation, Nov. 1999, 2 pages.

* cited by examiner

*Primary Examiner*—David Ton

(57) ABSTRACT

Methods are described herein, for improving the accuracy of propagation delay measurements of programmable electronic devices in a production environment. In one method, a built-in self-test is implemented by configuring an oscillator and a counter connected to each other within the PLD. The oscillator is enabled to oscillate for a pre-determined length of time and to cause the counter to count up at the end of each cycle of oscillation. The counter reading is correlated to an accurate propagation delay measurement by using a previously generated counter-delay correlation curve. In other methods, the counter is built outside of the logic of the PLD. Methods are described for adapting typical output macro cells to provide combinatorial feedback for configuring oscillators within PLDs without such capabilities.

18 Claims, 10 Drawing Sheets

PRIOR ART

MEASURING PROPAGATION DELAYS OF PROGRAMMABLE LOGIC DEVICES

TECHNICAL FIELD

The disclosure generally relates to testing of electronic circuits and more particularly relates to measuring propagation delays of programmable logic devices.

BACKGROUND

Various configurations of automatic test equipment (ATE) are used to measure product performance of programmable logic devices (PLDs) in a production environment. ATEs are well suited for measuring PLD parts in the production environment and serve as a low cost and expeditious alternative to sophisticated manual bench test equipment. However, ATEs are not as accurate as bench test equipment in measuring some of the critical performance parameters such as, signal propagation delay ($t_{PD}$). As performance speed of PLDs increases and propagation delay decreases, the problem of inaccurate propagation delay measurements is exacerbated. Without reliable methods of measuring the shorter propagation delays in high-speed parts, manufacturers of PLDs are unable to guarantee the performance of their parts at such high speeds. Thus, there is a need for reliable and efficient methods of measuring the propagation delay of PLDs in a production environment.

The lack of accuracy in ATE measurements of shorter propagation delays are due to several factors including, parasitic capacitance, contact variability and load variability due to the ATE at the output pins as the part is being measured. In parts with shorter delays, measurement errors caused by such factors can be significant. For example, in a PLD part with a 5 ns propagation delay, the typical measurement error caused by the ATE may be as much as 1 ns.

One way to improve the accuracy of propagation delay measurements is to reduce the effect of the errors due to the ATE. For example, a PLD can be configured to have a longer propagation path comprised of multiple direct propagation paths in series through the device prior to measuring its delay at one of the output pins, instead of measuring the delay of a single direct path through the device. Thus, if a PLD with a typical 5 ns delay can be configured to have 10 paths connected in series through the device, then the typical measurement error by an ATE of 1 ns can be spread out over a 50 ns (10×5 ns) delay measurement as opposed to a 5 ns delay measurement. Although this technique improves the accuracy of propagation delay measurements, the improvement is still not significant enough for accurately measuring the propagation delay in high-speed parts.

Another approach to improving the propagation delay measurement involves avoiding errors due to the variability of ATE load factors at the output pins by using a built-in self test (BIST). The BIST is implemented internally by specially configuring a programmable device and measuring the propagation delay related to such a device without using an ATE to directly measure the delay. For example, one such BIST is implemented by configuring a complex PLD (CPLD) part under test to have a ring oscillator and a counter driven by the ring oscillator for counting the oscillator's cycles. The counter is configured to provide the ATE with the count of the oscillator's cycles, which can be correlated to accurate measurements of the propagation delay for the part being measured. The correlation is accomplished by using highly-accurate bench test equipment to measure the delay of selected parts at variable conditions (e.g. various ambient temperatures) and then measuring the same parts using the BIST, as described above. The counter values from the BIST and the propagation delay measurements from the bench test equipment can be plotted later to generate a correlation curve between counter values and accurately measured propagation delays. Later on, when the counter values from BIST of other similar parts in the production environment are collected they can be translated to obtain accurate propagation delay measurements using the correlation curve.

Although the BIST for measuring propagation delay vastly improves the accuracy of such measurements, implementing the BIST method in simple PLDs (SPLDs) presents several challenges. SPLDs such as the industry standard 22v10 device do not have a sufficient number of programmable logic arrays (user-configurable logic) to configure a ring oscillator and a counter therein to implement the BIST described above. Furthermore, many SPLDs (e.g. 22v10's, 16v8's, and 6002's) do not have output logic macro cells (OLMC) that can be configured to provide the propagation path for the ring oscillator needed in the BIST described above.

Thus, there is a need for adapting BIST methods to SPLDs for accurately measuring their propagation delays.

SUMMARY

As described herein, methods are provided for measuring propagation delay related to programmable logic devices (PLD). These methods can be implemented to measure the propagation delay in a production environment.

In one aspect, a PLD part under test may be configured with an oscillator, and associated with a counter to implement a built-in self-test (BIST) within the PLD for measuring propagation delay. The counter is used to count the cycles of oscillation during a special test period. At the end of the test period, the counter value is extracted from the counter and correlated to an accurate propagation delay measurement. The correlation is accomplished using a correlation curve previously generated by measuring a statistically significant number of parts using both the BIST method and highly accurate bench test equipment.

In other aspects, several methods are provided for configuring the oscillator by using an uncorrupted combinatorial feedback. In one method, the uncorrupted combinatorial feedback for configuring the oscillator is generated by adapting one or more output macro cells (OLMC) of the PLD to configure a connection that bypasses the clocked register within the OLMC. In another method, the clocked register with the OLMC is converted to an unclocked register by providing a clocking scheme wherein the clock and the clock bar signal inputs to the register are both held simultaneously HIGH during a special test period.

In further aspects, several methods are provided for generating the special clocking scheme during the test period. In one aspect, a generated clock signal itself is processed locally to provide a clock bar signal that is held HIGH simultaneously with the clock signal. In another aspect, a special clock signal generator can be used for separating the global clock and clock bar signals and simultaneously holding them HIGH during the special test period.

In another aspect, methods are provided for serially shifting counter value data out of the PLD part under test to improve the efficiency of delay measurements in a production environment.

In further aspects, methods are described for further improving the accuracy of the BIST delay measurements by enabling the oscillator for a longer period of time in a test mode. Methods are also described for balancing the need for measurement accuracy with the limitations of system resources within the parts being tested.

These and other aspects will become apparent from the following detailed description, which makes references to the accompanying drawings.

DETAILED DESCRIPTION

Overview

Figure 1:
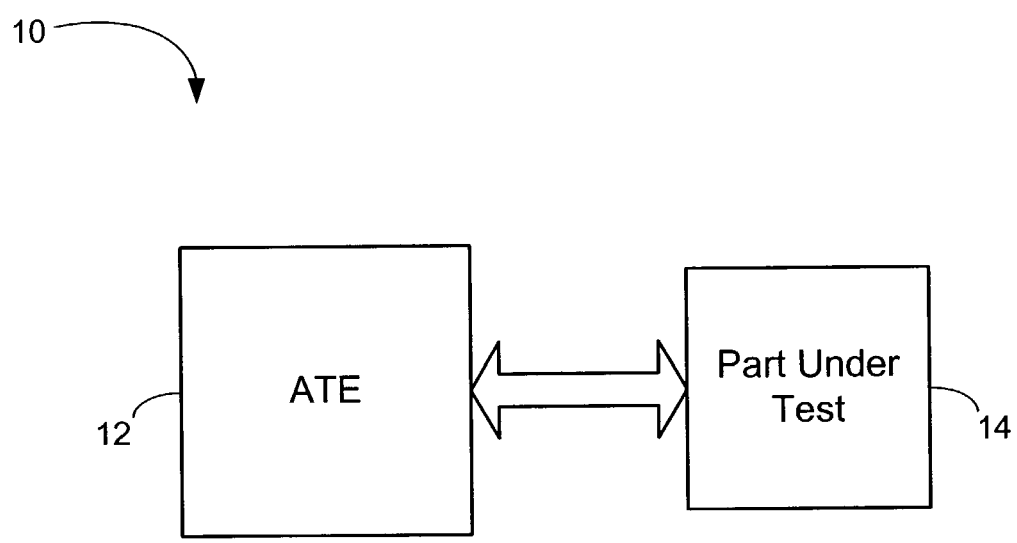
FIG. 1 is a block diagram illustrating the use of automated test equipment (ATE) for testing and measurement of programmable logic devices (PLD).

Automatic test equipment is widely used for measuring various performance parameters of a PLD part under test. For example, FIG. 1 shows an ATE 12 that is used to measure, among other parameters, the propagation delay of the part under test 14. Accurately measuring the propagation delay of high-speed PLD parts using an ATE can be challenging. However, the inaccuracies in measurements due to load factors and parasitic capacitance of the ATE can be overcome using a built-in self test (BIST). One such BIST is implemented by configuring an oscillator and a counter associated with the oscillator for counting cycles of oscillation. However, some PLDs lack sufficient logic array capacity to configure both the ring oscillator and the counter on the same part. Furthermore, many of the same PLDs cannot be configured to provide the combinatorial feedback necessary to configure an oscillator for the BIST. The following methods and systems can be used to overcome these and other obstacles to improve the accuracy of measuring the propagation delay of high-speed PLDs.

A Method of Implementing a BIST for Measuring Propagation Delay

Figure 2:
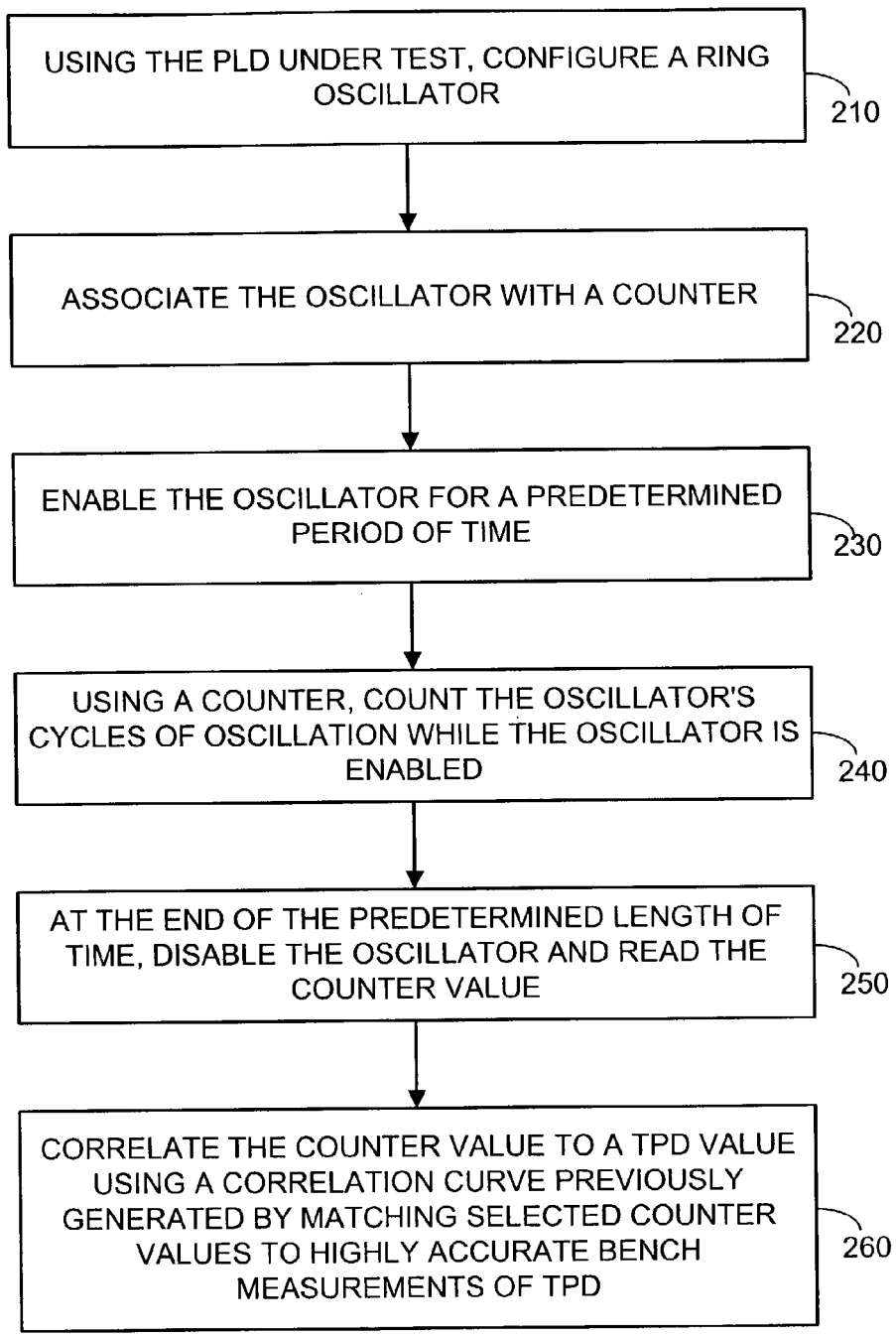
FIG. 2 is a flow chart of an exemplary method for implementing a built-in self test (BIST) for measuring the propagation delay of a PLD.

FIG. 2 describes an overall method of implementing a BIST for accurately measuring the propagation delay of a PLD by avoiding the errors caused by an ATE's load factor. At 210, the PLD under test is configured to implement a ring oscillator with a selected number of paths through the part. Each path of the oscillator is configured to correspond to one direct pass through the PLD part for measuring its propagation delay. At 220, the oscillator is associated with a counter configured in control logic of the PLD for counting cycles of oscillation. At 230, the oscillator is enabled to begin oscillating for a predetermined length of time. At 240, the counter is used to count the cycles of oscillation while the oscillator is enabled. At 250, the oscillator is disabled at the end of the predetermined period of time, causing the counter to stop counting, and the counter value is read. Then, at 260, the counter value is correlated to a propagation delay measurement of a similar PLD part using a correlation curve as described in further detail below with reference to FIGS. 3 and 4.

An Oscillator for Measuring Propagation Delay of a PLD Part

Figure 3:
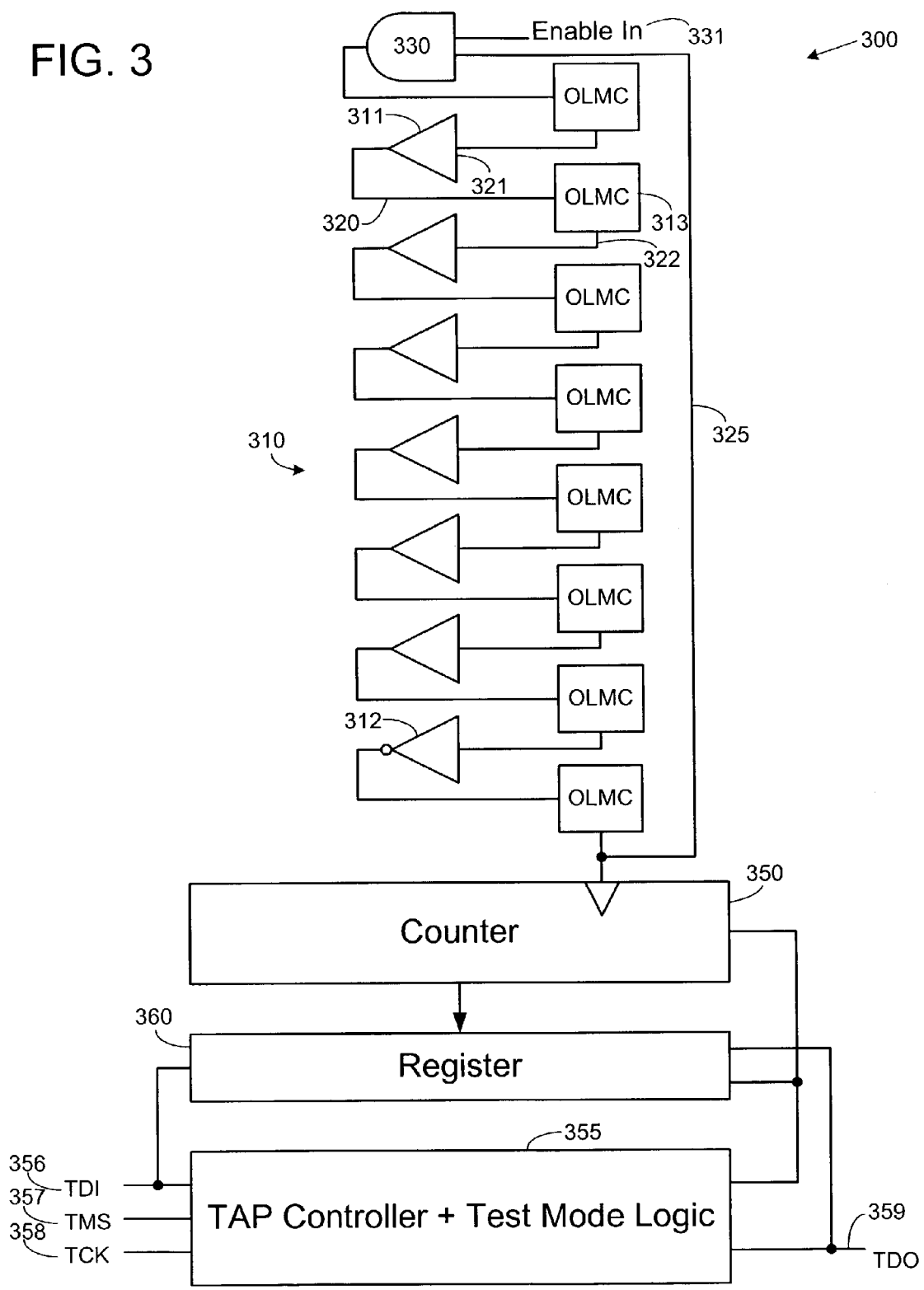
FIG. 3 is block diagram of an exemplary PLD configured to implement the BIST of FIG. 2 for measuring the propagation delay of the PLD.

In a PLD configured for BIST, the oscillator is configured with multiple paths with each path typically corresponding to one direct pass through the part. While the oscillator is enabled, it generates multiple cycles of oscillations. Each cycle of the oscillator corresponds to one count of the associated counter, which can be translated to a propagation delay measurement as will be described below. FIG. 3 shows an example of a PLD part 300 configured to implement a BIST for measuring the propagation delay. The PLD 300, as shown, is configured with an oscillator 310 comprising six buffers, such as the buffer at 311, one inverter 312 and an AND gate 330 with the enable in signal at 331. The oscillator 310 is enabled when the enable in signal at 331 goes HIGH. As shown in FIG. 3, the oscillator uses the inverter 312 and feedback loop 325 to generate multiple cycles of oscillations. Each cycle of oscillation continues to uptick the counter 350 by one until the enable in signal 331 goes to LOW.

Alternatively, an oscillator may be configured by replacing the AND gate 330 with an NAND gate and replacing the inverter 312 with a buffer. Other similar configurations of logic can be used to implement an oscillator such that an input signal into to the oscillator is fed back and is appropriately inverted to generate the oscillations that upticks the counter 350 for a predetermined period of time.

The oscillator 310 is configured with multiple propagation paths, such that each propagation path, such as 320, between the input of the buffer (311) at 321 and output of the corresponding OLMC (313) at 322 corresponds to one pass-through path of a normally configured PLD (with a direct path from an input pin to an output pin). Thus, the time delay related to one cycle of the oscillator 310 corresponds to a multiple of the propagation delay of a normally configured PLD. For example, the oscillator 310 has eight paths, similar to the path 320, and thus, the time delay related to one cycle of oscillation corresponds to eight times the propagation delay of a PLD 300 (when configured with a direct path between an input and output pin). Each cycle of oscillation upticks the counter 350 by one. Thus, each count of the counter 350 also corresponds to eight times the propagation delay of a normally configured PLD 300.

The number of paths, such as 320, chosen for the exemplary oscillator 310 can be changed to balance various factors (e.g. desired accuracy of the test, desired speed of the test). For example, if the number of paths, such as 320, is increased then the time delay associated with each cycle of the oscillator 310 also increases. This improves test accuracy because errors in measurements can be (statistically speaking) spread out over a higher number of propagation delay measurements. For instance, as noted above, a+/−1 ns error in measurement impacts a 50 ns cycle time measurement significantly less than a 5 ns cycle time measurement. However, the test will also take an incrementally longer time and requires a greater number of logic arrays for configuring the increased number of paths, such as 320. These factors may be balanced to arrive at a design suited according to particular needs.

Also, the length of time (230) selected for enabling (by using enable-in 331) the oscillator 310 can be chosen according to desired accuracy of the delay measurements. For example, increasing the length of time (230) also results in (statistically speaking) spreading out any errors within the BIST over a greater number of oscillator 310 cycles.

Figure 4:
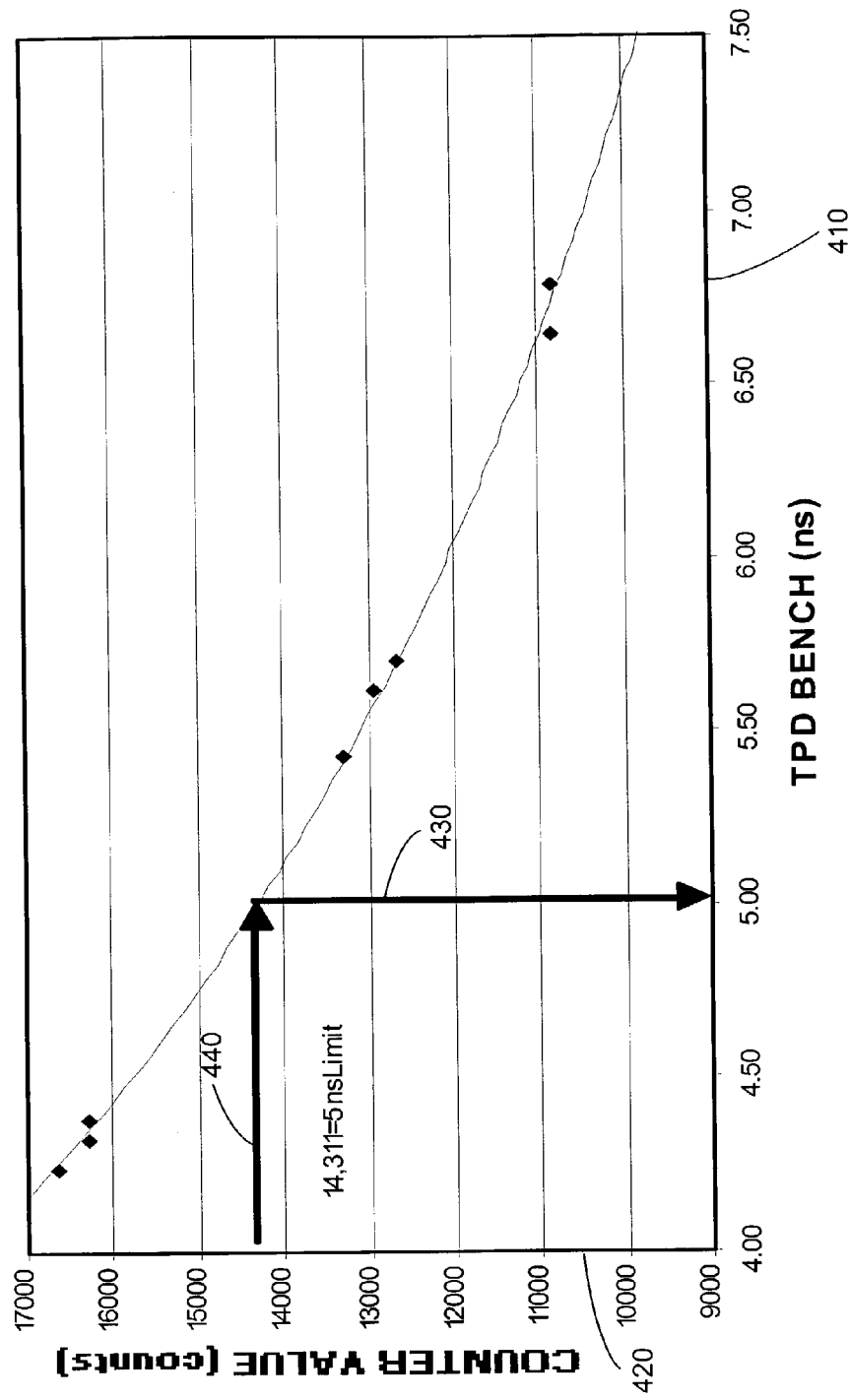
FIG. 4 is a chart illustrating an exemplary correlation curve for correlating a counter value result of the BIST to an accurate propagation delay measurement.

A Method of Correlating the Counter Values From a BIST to Accurately Measured Propagation Delay Values Once the oscillator 310 is disabled at the end of the pre-determined period of time, the output value of the counter 350 is read (250). This counter output value can be translated to an accurate measurement of propagation delay of the part 300 using reference data such as the correlation curve shown in FIG. 4. The correlation curve 400 is generated by selecting a statistically appropriate number of parts of a given part-type and using highly accurate bench test equipment to measure each part's propagation delay. Several different measurements may be taken to simulate the variability in conditions (such as ambient temperature) during the production and final use of such parts. The very same parts are later measured for their propagation delay under the same conditions using the BIST method as described above. The bench test values 410 and the counter values 420 are plotted to yield the correlation curve 400. When the BIST is again implemented on parts in the production environment, the correlation curve 400 can be used to correlate the new counter values to a propagation delay value. For example, a counter value of 14,311 (440) for an exemplary part as shown in FIG. 4 may correspond to a 5 ns delay (430). The correlation curve 400 is only an illustrative example. Such curves can change according to parameters such as the number of parts measured using the accurate bench measurements and other variables.

A Method for Configuring an Oscillator in a PLD Using Combinatorial Feedback

Figure 5:
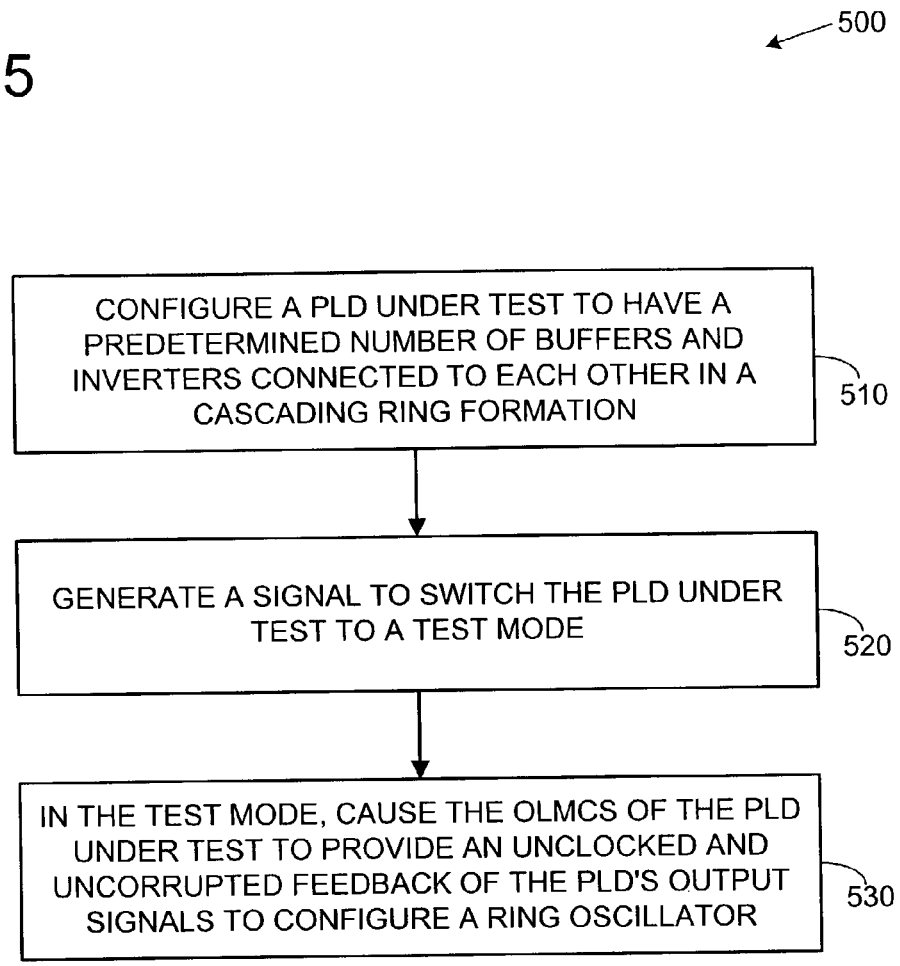
FIG. 5 is a flow chart of an exemplary method for configuring a PLD, as shown in FIG. 3, to have a ring oscillator.

FIG. 5 illustrates a general method 500 for configuring a PLD with an oscillator 310 for implementing the BIST of FIG. 2 for measuring the PLDs propagation delay. At 510, the PLD is configured with a pre-determined number of buffers and inverters using the programmable logic arrays as described with reference to FIG. 3 above. In order to adapt the PLD under test to implement the BIST of FIG. 2 the part is switched to a test mode at 520. While the PLD is in the test mode, the OLMC 313 of the PLD 300 under test is configured to provide the uncorrupted combinatorial (unclocked) feedback for configuring the oscillator 310. Thus, the period when the part is in a test mode should necessarily coincide with the period when the enable in 331 is held HIGH to activate the oscillator 310.

Figure 6:
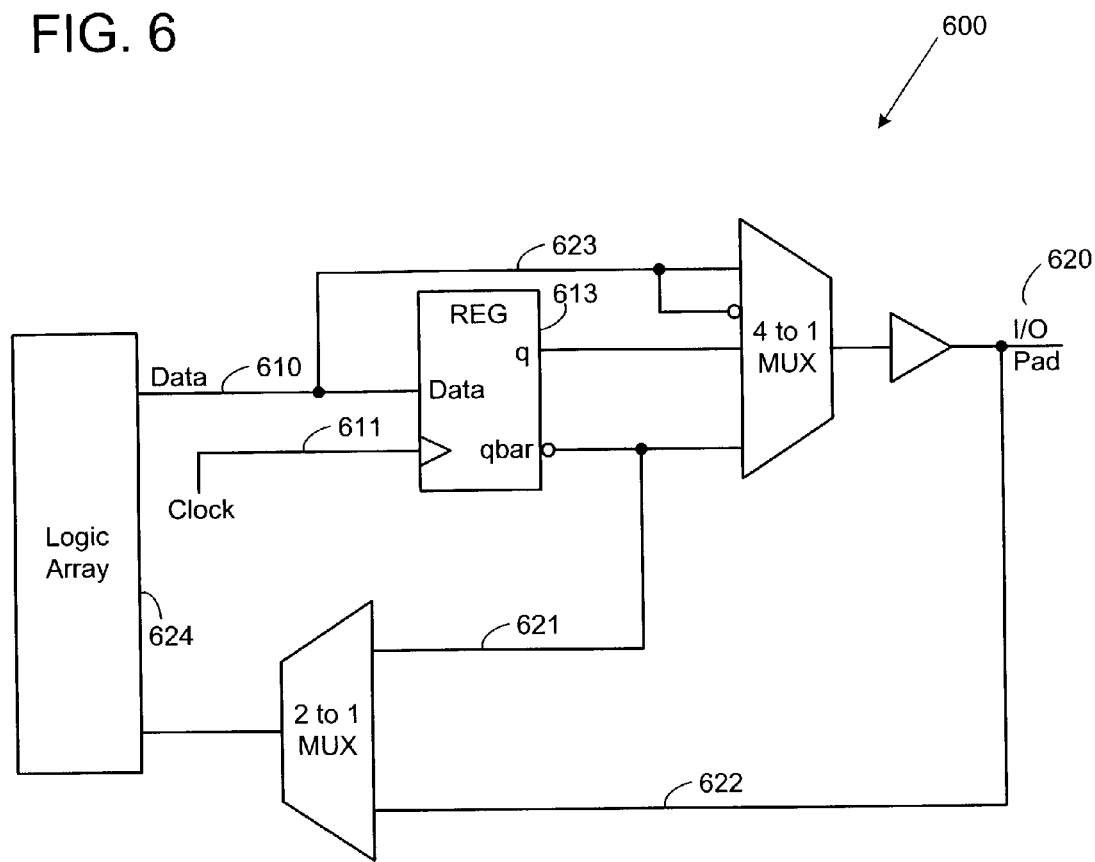
FIG. 6 is a block diagram of an original unaltered configuration of an output macro cell (OLMC) of a typical PLD without the capability of providing an uncorrupted combinatorial (unclocked) feedback for configuring a ring oscillator within the PLD and not including its I/O pads.

Within many PLDs their OLMCs (e.g. 22v10, 16v8, and 6002) are not typically capable of providing combinatorial feedback uncorrupted by the I\O pads and have to be adapted or further configured to so. For example, FIG. 6 illustrates a circuit diagram of an OLMC 600 (313) of a 22v10 SPLD in its original unaltered configuration. The processed data 610, coming in from the programmed logic array 624 is registered at 613 and multiplexed to the output pin 620. There are typically two feedback paths 621 and 622. However, the signal on feedback path 621 is clocked and therefore not combinatorial because its source, the register 613, is controlled by a clock 611. The signal on feedback path 622 (although unclocked) comes via the output pin 620 and therefore is corrupted by the variances due to ATE load factors, stray capacitance, etc. Thus, neither of the signals on the two available feedback paths 621 and 622 are well suited for providing the uncorrupted combinatorial feedback to implement a ring oscillator. Thus, a normally configured OLMC 600 in certain SPLDs has to be adapted to provide a feedback signal that is both combinatorial and uncorrupted. A method for such an adaptation or configuration is described below with reference to FIGS. 7–12.

Method for Configuring an OLMC Within a PLD to Provide Combinatorial Feedback

Figure 7:
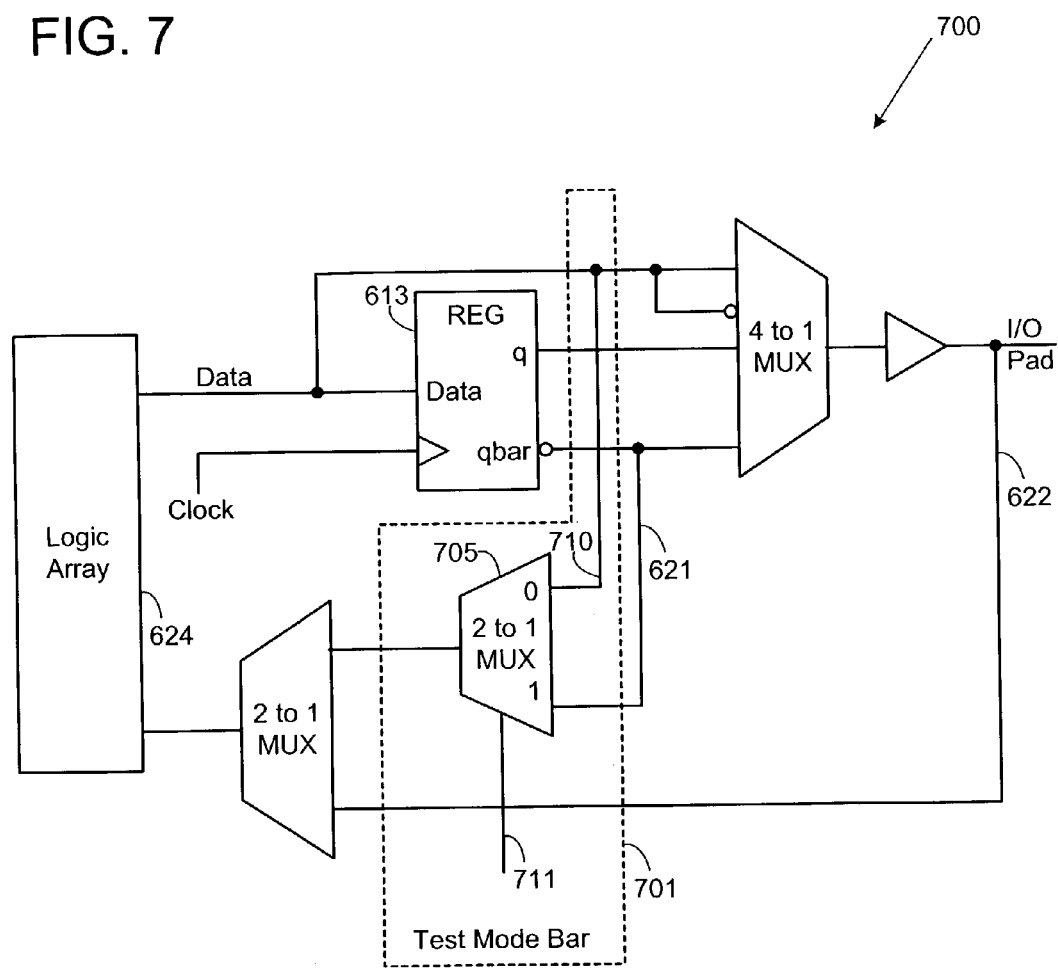
FIG. 7 is a block diagram of an OLMC of a typical PLD adapted to provide a register by-pass connection for configuring an uncorrupted combinatorial feedback.

FIG. 7 illustrates one way to configure an OLMC 700 within a PLD to provide an uncorrupted combinatorial feedback path. Generally, the specially configured OLMC 700 is similar to a normally configured OLMC 600 except for the changes high-lighted within the box 701 (for illustrative purposes only). To the normally configured OLMC 600 an additional 2-to-1 multiplexer 705 is added, which has two inputs 621 (a registered and clocked feedback path) and 710 (an unregistered and unclocked) feedback path (both feedback paths 621 and 710 are uncorrupted). The feedback path 710 simply by-passes the register 613 in order to remain unclocked. The 2-to-1 multiplexer 705 is configured to select between the regular feedback path 621 and the combinatorial feedback path 710 based on the value of the input signal Test Mode Bar 711. When the Test Mode Bar 711 is set to "0" the 2-to-1 multiplexer 705 selects combinatorial feedback path 710 for configuring a ring oscillator for implementing the BIST of FIG. 2. Otherwise, in the normal mode (when Test Mode Bar is "1") multiplexer 705 selects feedback path 621.

Figure 8:
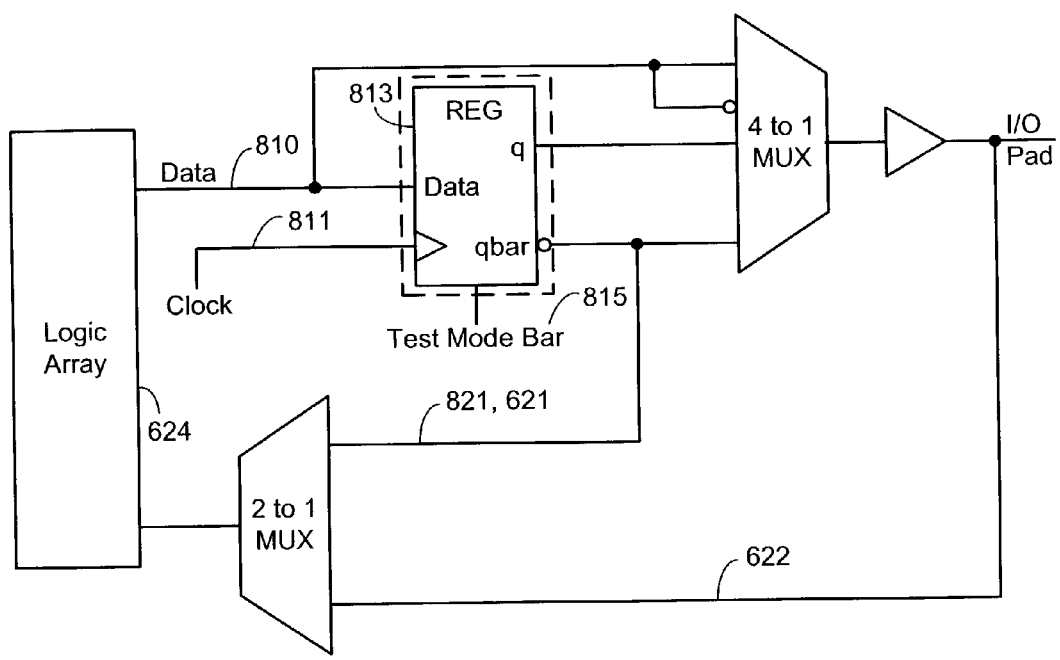
FIG. 8 is a block diagram of an exemplary OLMC of a typical PLD adapted to provide a pass through register for configuring an uncorrupted combinatorial feedback.

Alternative Methods for Configuring an Output Cell (OLMC) Within a PLD to Provide Combinatorial Feedback Other methods for configuring an OLMC within a PLD to provide the combinatorial feedback for configuring a ring oscillator involve providing an unclocked feedback through the register 613 (i.e., without by-passing it as shown in FIG. 7) by altering the way the register 613 is clocked. As shown in FIG. 8, one method of providing the combinatorial feedback signal 821 through the register 813 is to alter its normal clocking mechanism to allow the data on path 810 to pass through the register 813 unclocked while the device is in a test mode (the Test Mode Bar signal 815 is "0"). Otherwise, in the normal mode (when the Test Mode Bar 815 is "1" or HIGH) the data signal is clocked through the register before appearing on feedback path 621.

Figure 9:
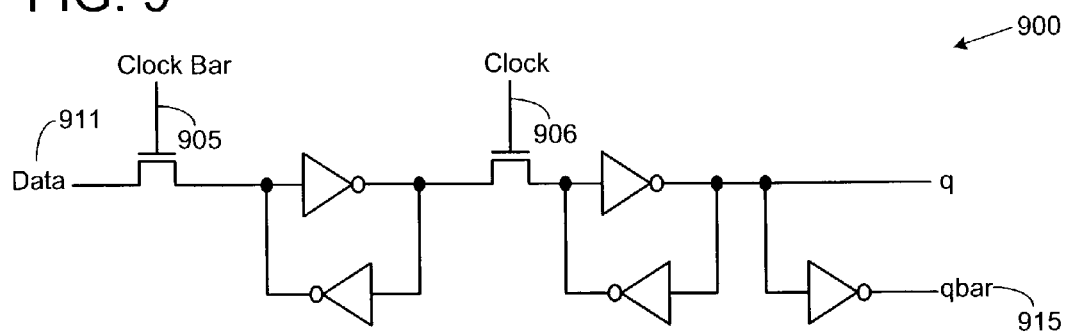
FIG. 9 is a logic diagram of an exemplary clocked register within the OLMC of a typical PLD.
Figure 10:
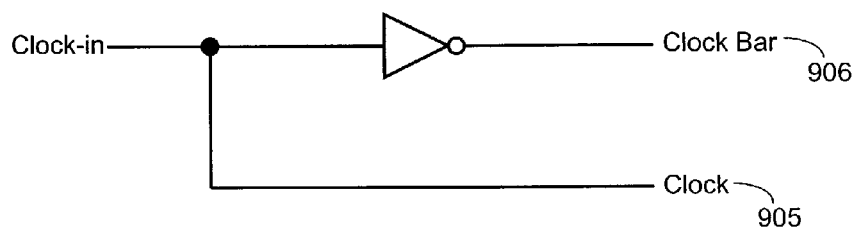
FIG. 10 is a logic diagram illustrating the complementary nature of an exemplary clock and clock bar signals for clocking the register of FIG. 9.

FIG. 9 illustrates the normal clock configuration 900 of a register 613 with the data input 911 being registered under the control of clock bar 905 and clock 906 signals. As shown in FIG. 10, clock bar 905 and clock 906 signals are normally logical complements of each other. Thus, when clock 906 is in its enabling state of "1" (HIGH) clock bar 905 is in its disabling state of "0" (LOW). However, clock 906 and clock bar 905 signal can be altered locally or a circuit generating such signals globally can be adapted to separate the clock signal 906 from the clock bar signal 905 and hold both signals in an enabling state of "1" (HIGH) during the test mode (Test Mode Bar 821 is "0"). This enables an unclocked path from 911 to 915 and forces register 613 to pass an oscillator signal without the register being clocked.

Figure 11:
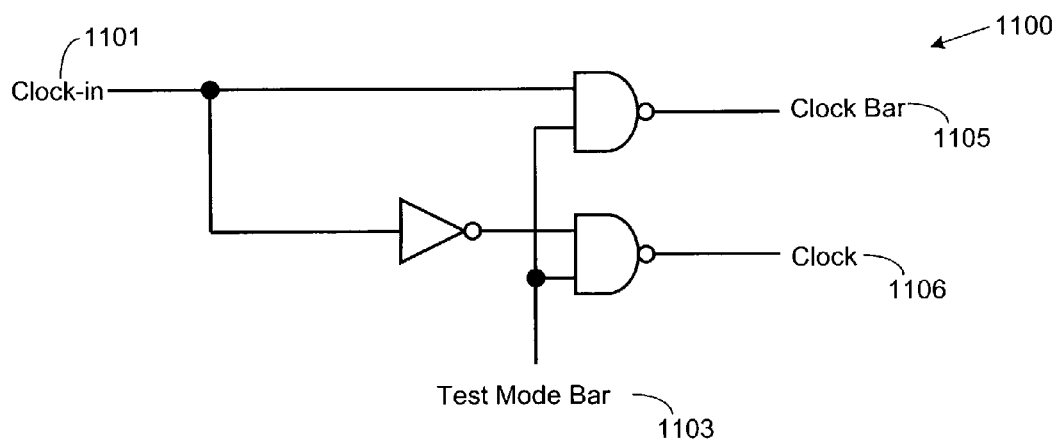
FIG. 11 is a logic diagram of a circuit for generating an exemplary clocking scheme to provide a combinatorial feedback using a pass through register as shown in FIG. 8.

FIG. 11 illustrates a gate-level logic diagram 1100 of a clock circuit that can be implemented to hold both clock 1105 and clock bar 1106 HIGH ("1") regardless of the state of clock-in signal 1101 when the device is in test mode (Test Mode Bar 1103 is "0").

Figure 12:
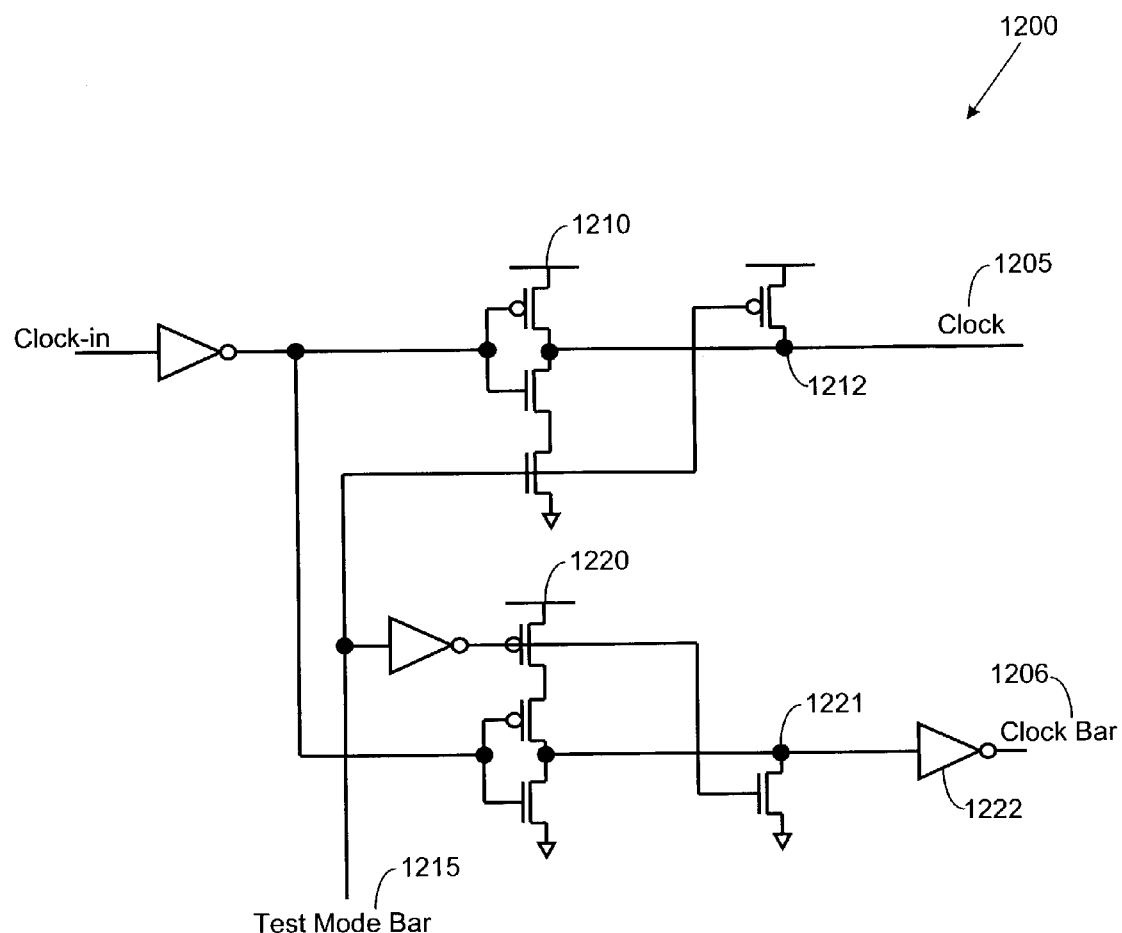
FIG. 12 is a diagram illustrating an exemplary circuit for implementing the gate level design of FIG. 11.

FIG. 12 illustrates a circuit diagram 1200 of a specific implementation of the gate-level logic diagram 1100 of FIG. 11. In circuit 1200, the tri-statable inverters 1210 and 1220 are turned OFF when the device is put in test mode (Test Mode Bar 1215 is "0"). In addition, the signal is pulled high at 1212 and pulled down at 1221 (and inverted at 1222) yielding a clock 1205 and clock bar 1206 that are both held high when the Test Mode Bar is "0". The circuit 1200 of FIG. 12 is one implementation of the logic of FIG. 11 that is well suited for optimizing path delays. Other similar circuits may be configured to yield a clock and clock bar signal high during test mode. Such a circuit may be used to reconfigure clock and clock bar signals locally at each OLMC or may be used to configure a global clock signal generator.

A Method for Reading the Counter Value of a PLD Configured to Implement a BIST for Measuring the PLDs Propagation Delay Referring back to FIG. 3, once the ring oscillator is configured using the buffers 311, inverter 312 and the specially configured OLMC 313 (while in test mode), the BIST may be initiated to count the oscillations of the oscillator 310 during a selected period. At the end of that period, the counter 350 will have a counter value that can be correlated to a propagation delay measurement using a correlation curve (FIG. 4). However, reading the parallel data from counter 350 in a production environment presents several problems. FIG. 3 illustrates a PLD 300 specially configured to control the BIST process and serially shift the counter data at the end of the test period out to an ATE for completing the correlation process (260).

A TAP controller 355 (e.g., a JTAG controller) is provided to control the BIST measurement of propagation delay. The TAP controller 355 receives test data input (TDI) at 356, test mode select 357 (TMS), test clock 358 (TCK) and provides the serial output TDO of the counter value at 359. Prior to beginning the testing period, the TAP controller 355 resets the counter 350 and adapts the OLMCs to provide the combinatorial feedback as described above. Then once the enable in signal 331 goes to HIGH (test period begins) the BIST process is initiated and the counter 350 is updated until the enable in 331 goes to LOW (end of the test period). The register 360 is provided to parallel load the counter value out of the counter 350 at the end of the test period. The TAP controller is capable of reading the parallel data out from the register 360 and provide a serial out at TDO 359, which can correlate the counter value to a propagation delay measurement.

The ability to provide a serial output instead of directly reading the register data improves the efficiency of measuring propagation delay in several ways. For example, the serial output at TDO 359 reduces the number of pins needed to gather the counter 350's value. Thus, the probing required to read the counter 350 is reduced and such data can be read at a wafer level (instead of at the individual device level) for multiple devices in a production environment. This speeds up the testing process and reduces chances of damaging the parts being tested. Such a configuration is possible by joining the TDO 359 pins of several devices on a wafer.

The counter 350 is configured within the PLD 300 (at the periphery) without the need to use the limited capacity of the programmable logic. In this manner, the capacity of the counter (ability to count higher number of cycles) is not limited by the capacity of programmable logic arrays within a given part. However, it may be possible to implement the counter 360 and the ring oscillator 310 within the PLD by using the logic arrays. However, this may not be desirable because it reduces the accuracy of the measurement if the device being configured has a limited logic capacity.

Alternatives

Having illustrated and described the principles of the illustrated embodiments, it will be apparent to those skilled in the art that the embodiments can be modified in arrangement and detail without departing from such principles. For example, the BIST implementation described with reference to FIG. 3 is only an illustrative example with particular reference to a standard 22v10 PLDs. However, the methods of the BIST described above can be implemented using other configurations according to the needs of the testing speed, accuracy and configuration of the part under test.

In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

The invention claimed is:

1. A system for measuring the propagation delay of a programmable logic device, comprising:
   a ring oscillator configured within the device when the device is in a test mode; and
   a counter coupled to the oscillator, wherein, during a test period, the oscillator is enabled to oscillate and the counter is programmed to count the oscillator's cycles in the test period,
   wherein the oscillator is configured using a combinatorial feedback that is implemented in one or more of the following configurations:
      a connection bypassing a clocked register within one or more output cells of the device; and
      a connection through an unclocked register within one or more of the output cells of the device.

2. The system of claim 1, wherein the unclocked register is implemented by holding both clock and clock bar signal related to the clocked register simultaneously HIGH.

3. The system of claim 1, wherein each of the cycles correlates to a propagation delay measurement of the device.

4. The system of claim 1, wherein the oscillator has multiple propagation paths and one or more of the multiple propagation paths through the oscillator correlates to one direct propagation path through the device.

5. The system of claim 1 further comprising, a controller adapted for one or more of the following:
controlling the programmable device during the test period;
resetting the counter at the beginning of the test period; and
serially shifting a final counter value related to the counter as output of the device.

6. The system of claim 1 further comprising, a register for serial shifting a counter value out of the counter at end of the test period.

7. The system of claim 1 further comprising, automatic test equipment connected to the device and the counter and capable of correlating a counter value related to the counter at end of the test period to a propagation delay measurement of the device.

8. A programmable logic device configured to measure the device's propagation delay, comprising:
a ring oscillator configured in macrocells of the device while the device is in a test mode; and
a counter associated with the ring oscillator and adapted for counting the oscillator's cycles.

9. The programmable logic device of claim 8, wherein the ring oscillator comprises multiple macrocells coupled in series by multiple propagation paths.

10. A method for measuring propagation delay of a programmable logic device, comprising:
activating a test mode of operation for the device;
transmitting an oscillating signal through the device; and
counting cycles of oscillation related to the signal,
wherein the oscillating signal is transmitted by adapting one or more output cells of the device being measured to provide a combinatorial feedback that is configured using one or more of the following methods:
bypassing a clocked register within the output cell of the device; and
converting the clocked register to a unclocked register.

11. The method of claim 10 further comprising, correlating the cycle count to a correlation curve to obtain the propagation delay.

12. The method of claim 10 further comprising,
serially shifting the cycle count value to test equipment for translating the cycle count value to obtain the propagation delay measurement of the device.

13. The method of claim 10, wherein the clocked register is converted to an unclocked register by one or more of the following methods:
processing a clock signal controlling the clocked register to generate a clock bar signal that is simultaneously HIGH with the clock signal during the test mode; and
configuring a clock signal generator to generate the clock signal and clock bar signal that are simultaneously at HIGH during the test mode.

14. A method of measuring propagation delay of a programmable logic device (PLD), comprising:
configuring an oscillator in the macrocells of a PLD, at least part of the propagation path of the oscillator passing through registers within the macrocells;
forcing the registers to pass an oscillator signal in the propagation path without the register being clocked;
configuring a counter coupled to the oscillator, the counter operable to count the oscillations of the oscillator;
enabling the oscillator to oscillate for a given time period;
reading from the counter a count of the number of oscillations during the given time period; and
comparing the count with reference data to determine the propagation delay of the PLD.

15. The method of claim 14, wherein the oscillator is a ring oscillator.

16. The method of claim 14, wherein the counter is configured in control logic of the PLD.

17. A programmable logic device comprising:
a programmable logic array;
a macrocell coupled to the array, the macrocell having a register operable to pass a data signal in response to a clock signal; and
a clock circuit operable to force the macrocell register to pass the data signal without the register being clocked.

18. The programmable logic device of claim 17, wherein the register is responsive to a clock signal comprised of clock and clock bar signals, and the clock circuit is operable to hold both signals in an enabling state, thereby forcing the register to pass the data signal without the register being clocked.

* * * * *